United States Patent [19]

Sakai et al.

[11] 4,419,684

[45] Dec. 6, 1983

[54] SEMICONDUCTOR INTEGRATED CIRCUIT

[75] Inventors: Yoshio Sakai, Hachioji; Hideo Nakamura, Hinodemachi, both of Japan

[73] Assignee: Hitachi, Ltd., Tokyo, Japan

[21] Appl. No.: 224,946

[22] Filed: Jan. 14, 1981

[30] Foreign Application Priority Data

Jan. 21, 1980 [JP] Japan .................................. 55-4621

[51] Int. Cl.³ ............................................ H01L 27/04
[52] U.S. Cl. ........................................ 357/40; 357/41; 357/48; 357/52; 357/51
[58] Field of Search ...................... 357/41, 52, 53, 13, 357/14, 47, 48, 40

[56] References Cited

U.S. PATENT DOCUMENTS 3,601,668  8/1971  Slaten et al. ........................... 357/52
3,612,964 10/1971  Kawazu .................................. 357/14
4,167,748  9/1979  D'Angelo et al. ..................... 357/13

Primary Examiner—James W. Davie
Attorney, Agent, or Firm—Antonelli, Terry & Wands

[57] ABSTRACT

Well regions of p-type are disposed in a surface region of an n-type Si substrate of a semiconductor integrated circuit. The p-type well regions are arranged in the shape of islands, and various semiconductor elements are formed in the p-type well islands. The substrate surface region between the p-type well islands is filled with a depletion layer, and an interconnection layer is disposed on an insulating film over that body region contained within the depletion layer.

6 Claims, 14 Drawing Figures

SEMICONDUCTOR INTEGRATED CIRCUIT

BACKGROUND OF THE INVENTION

This invention relates to a semiconductor integrated circuit. Particularly, it relates to a structure of the interconnection portion in the semiconductor integrated circuit.

FIG. 1 shows an example of the structure of a conventional semiconductor integrated circuit. In the Figure, two insulated-gate field effect transistors (MOSTs) 8 and 9 are illustratively shown as elements within the integrated circuit. Referring to FIG. 1, numeral 2 designates a semiconductor (e.g. Si) substrate of the p-type conductivity, numerals 3, 301, 302, 303, and 304 insulating films (of, e.g. $SiO_2$), numerals 501, 502, 503, and 504 source and drain regions ($n^+$-type regions), numerals 101, 103, 104, and 106 source and drain electrodes, and numerals 102 and 105 gate electrodes. Shown at numeral 1 is an interconnection layer within the integrated circuit, which is disposed on the thick insulating film 3 for isolating the elements from each other and which connects the electrodes 101–106 of the elements appropriately. In the structure of FIG. 1, the two MOSTs 8 and 9 are isolated from each other by the thick insulating film 3 and a $p^+$-type region (not shown) underlying it.

In the semiconductor integrated circuit (IC), especially a largescale integrated circuit (LSI), as shown in FIG. 1, the parasitic capacitance of the interconnection increases with the increase of the packing density. For high speed operation of the integrated circuit, however, the parasitic capacitance of the interconnection needs to be reduced. In an LSI employing a silicon (Si) body (substrate, eptiaxialgrown layer, well-diffused layer, or the like), a thick insulating film (of, e.g. $SiO_2$) 3 for isolating the elements has heretofore been provided between the interconnection layer 1 and the silicon body 2 as shown in FIG. 1. In this case, the capacitance C between the interconnection layer 1 and the silicon body 2 is expressed as a series capacitance which consists of a capacitance $C_{ox}$ due to the $SiO_2$ film 3 and a capacitance $C_d$ due to a depletion layer 4 underneath this $SiO_2$ film. Since, however, a channel stopper layer of high impurity concentration is usually formed in the surface of the silicon body underlying the $SiO_2$ film 3, the depletion layer 4 (dotted line) does not extend sufficiently thick underneath the $SiO_2$ film 3. Therefore, the capacitance C between the interconnection layer 1 and the silicon body 2 is substantially determined by the capacitance $C_{ox}$ due to the $SiO_2$ film 3 underneath the interconnection layer. In order to reduce this capacitance $C_{ox}$, the thickness of the $SiO_2$ film 3 needs to be increased. However, when the thickness of the insulating film 3 is increased, the height of the step or raised portion of the surface of the integrated circuit becomes large, leading to such problems as severance of the interconnection layer, etc. A reduction of the interconnection parasitic capacitance by increasing the thickness of the insulating film is, therefore, subject to limitations.

Accordingly, the semiconductor integrated circuit has had the problem that even when the packing density is enchanced, the parasitic capacitance of the interconnection is increased thereby hampering the high speed operation of the circuit.

SUMMARY OF THE INVENTION

This invention has for an object the provision of a semiconductor integrated circuit having a structure of an interconnection portion which can reduce the capacitance between an interconnection layer and a semiconductor body without thickening an insulating film underneath the interconnection layer.

In order to accomplish this object, according to a semiconductor integrated circuit device of this invention, in the surface region of a semiconductor body corresponding to an interconnection portion or in the vicinity thereof, a well-diffused region of a conductivity type opposite to that of the body is disposed, so as to form a thick depletion layer extending within the well-diffused region or from the well-diffused region into the body, and an interconnection layer is disposed on the substrate surface over the thick depletion layer through an insulating film. Thus, the semiconductor integrated circuit of this invention has the capacitance parasitic at the interconnection reduced.

DESCRIPTION OF THE PREFERRED EMBODIMENTS

Hereunder, this invention will be described in detail with reference to the various embodiments.

EMBODIMENT 1

Figure 1:
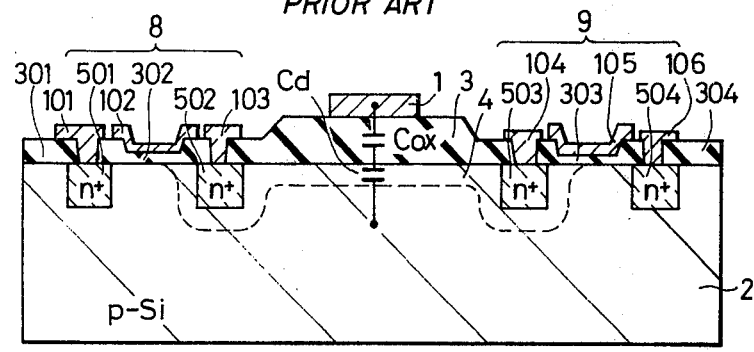
FIG. 1 is a sectional view showing the structure of an interconnection portion in a conventional semiconductor integrated circuit.
Figure 2:
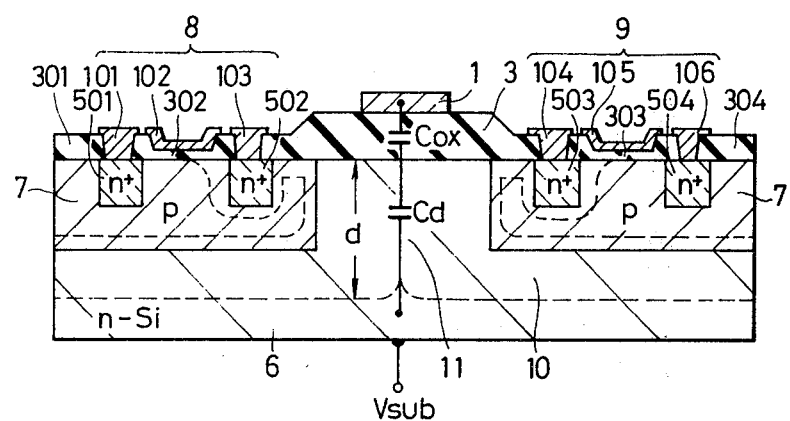
FIG. 2 is a sectional view showing the structure of an interconnection portion in an embodiment of a semiconductor integrated circuit according to this invention.
Figure 3:
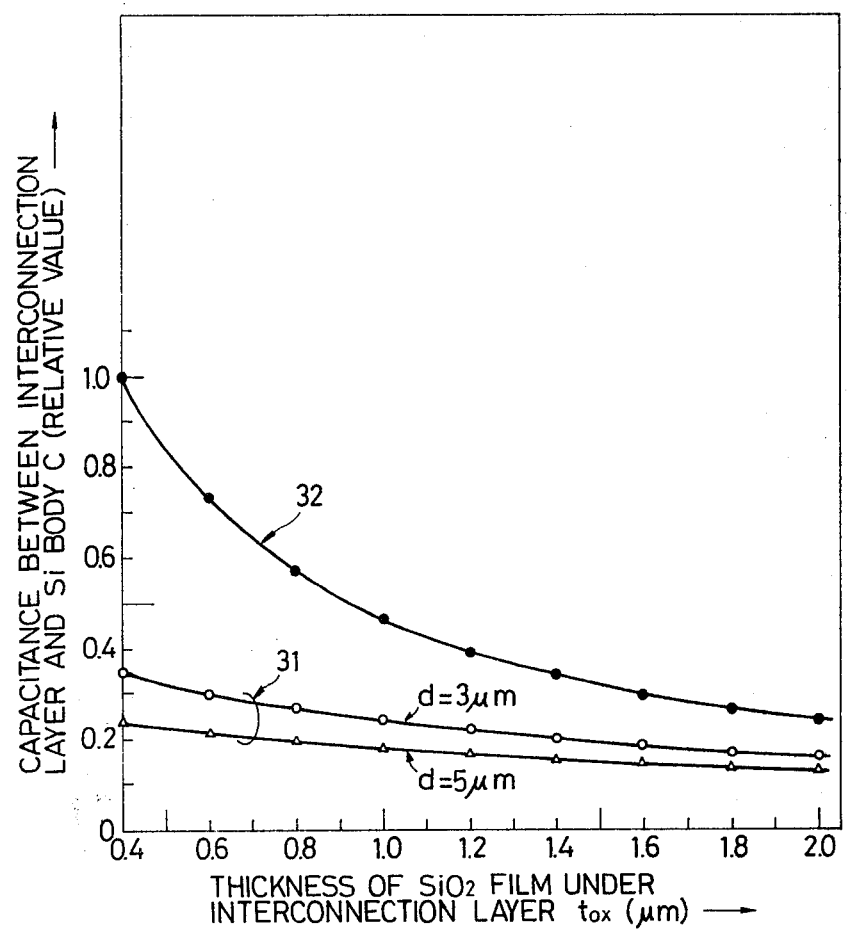
FIG. 3 is a graph for comparing the parasitic capacitances of the interconnections in the semiconductor integrated circuit of this invention and the conventional semiconductor integrated circuit.

FIG. 2 shows a novel structure for reducing the interconnection parasitic capacitance according to this invention. Within a silicon body 6 of the n-type which has a low impurity concentration on the order of $10^{14}\,cm^{-3}$ and to which a positive potential $V_{sub}$ is applied (when the body is of the p-type, a negative potential $-V_{sub}$ is applied thereto), a p-type region 7, which has a comparatively low impurity concentration on the order of $10^{15}\,cm^{-3}$ and which is 12–6 μm deep, is formed (when the body is of the p-type, an n-type region is formed, and hereinbelow, this p-type region (7) shall be written "p-type well"). Elements, such as MOSTs, constructed of $n^+$-type diffusion layers 501–504, etc., are formed within this p-type well. In a portion corresponding to an interconnection layer 1, the p-type well 7 is divided or opened. In the resulting p-type well opening region or spacing region 11, a depletion layer (dotted line) 10 extends which is formed between the p-type well and the n-type body. Where the width of the p-type well opening or spacing region 11 is small, (for example, where it is 6–10 μm with the depth of the p-type well 3 μm) depletion layers extending from both sides of the opening or spacing region 11 come into contact with each other, so that the depletion layer 10 is formed in the entire opening or spacing region 11 of the p-type well. In this case, the thickness d of the depletion layer as viewed from the surface of the silicon body becomes equal to or greater than the depth of the p-type well. By way of example, where the depth of the p-type well is 3 μm, where the p-type well is grounded and where a voltage of 5 V is applied to the n-type silicon body, the depth d of the depletion layer formed in the p-type well opening or spacing region as measured from the surface of the silicon body becomes as large as about 5 μm. Therefore, where the interconnection layer 1 is formed on the p-type well opening or spacing region 11 through an insulating film 3 such as SiO₂ film, the parasitic capacitance C between the interconnection layer 1 and the silicon body 6, consisting of the capacitance $C_{ox}$ of the SiO₂ film and the capacitance $C_d$ of the depletion layer, becomes much smaller than in the conventional structure because the depletion layer capacitance $C_d$ is very small. FIG. 3 illustrates the interconnection-body capacitances of the structure according to this invention (FIG. 2) and the conventional structure (FIG. 1), with respect to variation in the thickness of the SiO₂ film beneath the interconnection layer (31: structure of this invention, 32: conventional structure). In the conventional structure, the interconnection parasitic capacitance does not decrease unless the SiO₂ film is thickened as has already been stated, whereas in the structure according to this invention, the interconnection parasitic capacitance is sufficiently smaller than that of the conventional structure even when the SiO₂ film is not thickened. For example, when the thickness d of the depletion layer in the spacing region of the p-type well (the p-type well opening) as measured from the silicon surface is 5 μm, the interconnection parasitic capacitances of the structure according to this invention, in the cases where the thicknesses of the SiO₂ films under the interconnections are 0.4 μm and 1 μm, decrease to approximately 1/4.5 and 1/2.5 of those of the conventional structure, respectively. For this reason, in ICs and LSIs employing the structure according to the present invention, interconnection parasitic capacitances become small and high speed operation is afforded.

EMBODIMENT 2

Figure 4:
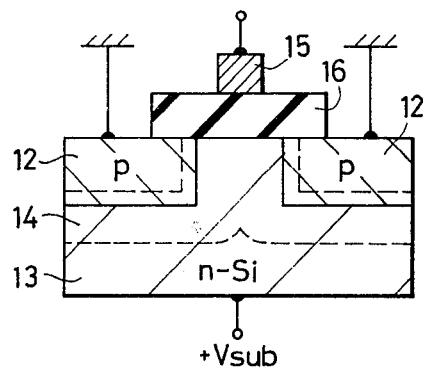
FIGS. 4, 5, and 6 are sectional views each showing the structure of an interconnection portion in another embodiment of the semiconductor integrated circuit according to this invention.
Figure 5:
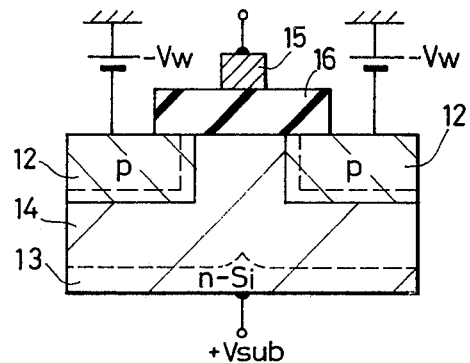

The reduction of the interconnection parasitic capacitance according to this invention is realized by decreasing the depletion layer capacitance $C_d$ underneath the interconnection layer. In the present embodiment, the thickness d of the depletion layer to be formed in the p-type well spacing or opening region is further increased, to thereby further decrease the depletion layer capacitance $C_d$ underneath the interconnection layer. To this end, in contrast to the case where a low doped p-type well 12 is grounded as shown in FIG. 4, the p-type well 12 has a negative voltage $-V_w$ of several volts applied thereto as shown in FIG. 5, to increase the thickness of the depletion layer (dotted line) 14 between the p-type well 12 and an n-type silicon body 13 to which a positive voltage $+V_{sub}$ is applied. Thus, the parasitic capacitance between an interconnection layer 15 and the substrate 13 can be reduced even further. Shown at 16 is an insulating film of SiO₂ or the like. Where the conductivity types of the body and the well are inverted, the polarities of the applied voltages may be inverted.

Figure 6:
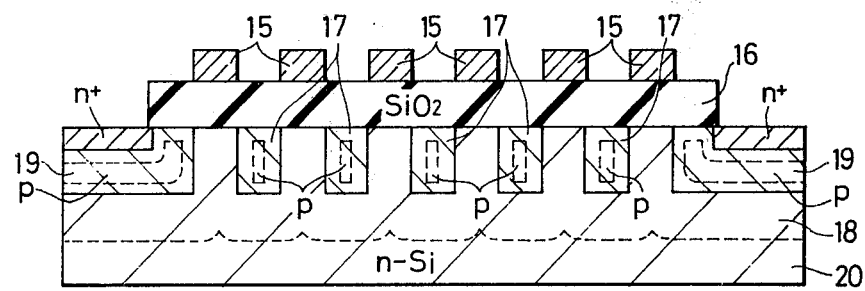

EMBODIMENT 3

Where an interconnection portion within an LSI is of a large area and has a large number of interconnection layer 15, a large number of p-type well islands (intermediate regions) 17 are formed in the interconnection portion as in an embodiment shown in FIG. 6, whereby the interconnection parasitic capacitance can be reduced by a thick depletion layer (dotted line) 18 extending in the entire interconnection region. It is also possible that the p-type wells 17 within the interconnection portion and a p-type well 19 in which elements are formed are separately formed, and that only the p-type wells 17 within the interconnection portion may have a still lower concentration, so that their potential are effectively floating, whereby the depletion layer 18 is extended by only the built-in potential between the p-type well 19 and an n-type body 20.

EMBODIMENT 4

Figure 7:
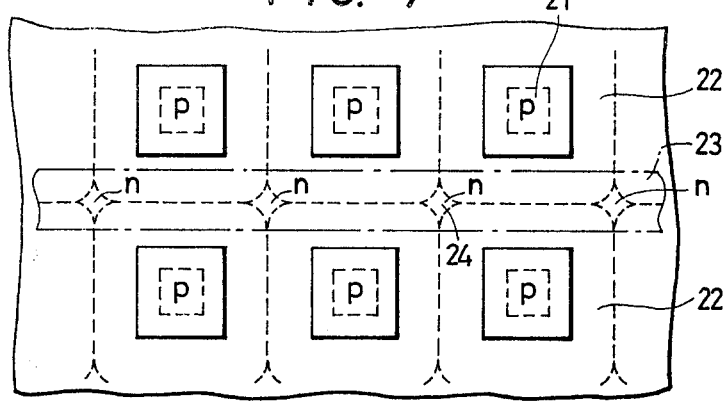
FIGS. 7, 8, and 9 are plan views each showing the structure of an interconnection portion in a further embodiment of the semiconductor integrated circuit according to this invention.

Regarding the arrangement of p-type well islands in an interconnection portion, as shown in FIG. 7, square p-type well islands (solid lines) 21 each having a one side dimension of 3–6 μm, by way of example, are densely arranged to form thick depletion layers (dotted lines) 22 in the entire interconnection portion. An interconnection layer (one-dot chain lines) 23 runs over the depletion layer region 22. However, parts 24 in which the depletion layer is not formed remain in the interconnection portion.

EMBODIMENT 5

Figure 8:
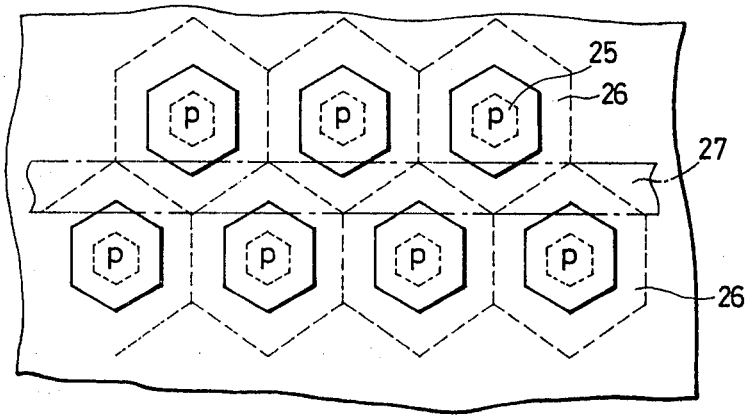

As shown in FIG. 8, regular-hexagonal p-type well islands (solid lines) 25 each having a one side dimension of 3–6 μm, by way of example, are arranged, whereby a denser arrangement than in FIG. 7 is provided and opening or spacing regions of the p-type well islands are fully formed with depletion layers (dotted lines) 26. An interconnection layer (one-dot chain lines) 27 runs over the depletion layers 26.

EMBODIMENT 6

In both Embodiment 5 (FIG. 7) and Embodiment 6 (FIG. 8), the p-type wells have been arranged in the shape of islands. However, where the parts of such p-type well islands are opening or spacing regions of a p-type well, a thick depletion layer is formed in an interconnection portion and, hence, a reduction of the interconnection parasitic capacitance is possible. Since, in this case, the p-type well is entirely continuous, it can be connected to a certain potential as shown in FIG. 4 or FIG. 5.

EMBODIMENT 7

Figure 9:
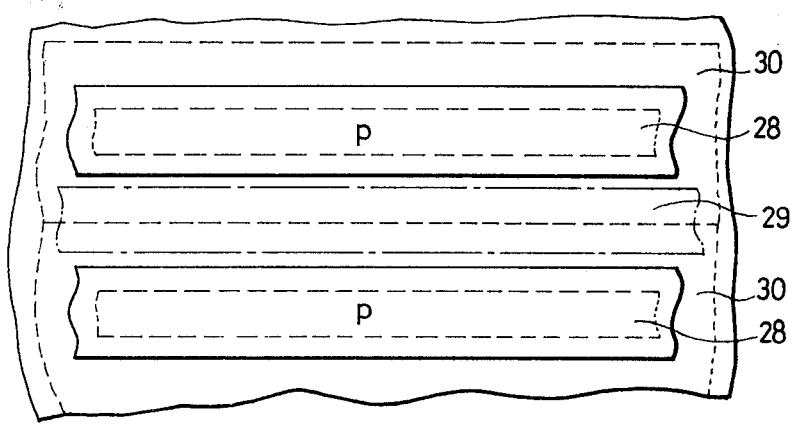

As an arrangement of p-type wells in an interconnection portion, the p-type wells or p-type well spacing regions (solid lines) 28 can also be lengthened horizontally (or vertically) as shown in FIG. 9. Such an arrangement permits a simplification of the layout. Dotted lines 30 indicate depletion layers, and one-dot chain lines 29 are an interconnection layer.

EMBODIMENT 8

Figure 10A:
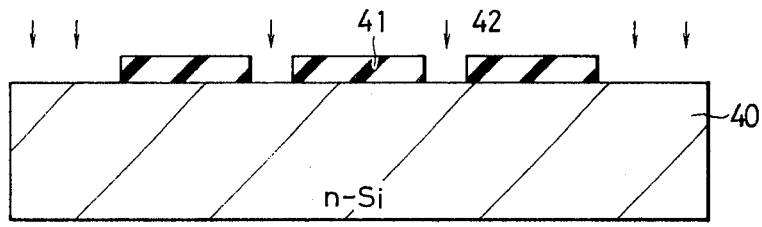
FIGS. 10A, 10B, 10C, 10D, and 10E are sectional views showing the steps of a method of manufacturing an interconnection structure according to an embodiment of the semiconductor integrated circuit of this invention.

A method of manufacturing the structure of an interconnection portion according to this invention is illustrated in FIGS. 10A–10E. First, as shown in FIG. 10A, an n-type silicon substrate 40 having a low impurity concentration on the order of $10^{14}$ cm$^{-3}$ is ion-implanted with a p-type impurity, such as boron, to the amount of $10^{11}$–$10^{13}$ cm$^{-2}$ at an implantation energy of, e.g. 30–100 KeV by employing as a mask an SiO$_2$ film or resist film 41 which is 0.5–1 μm thick.

Figure 10B:
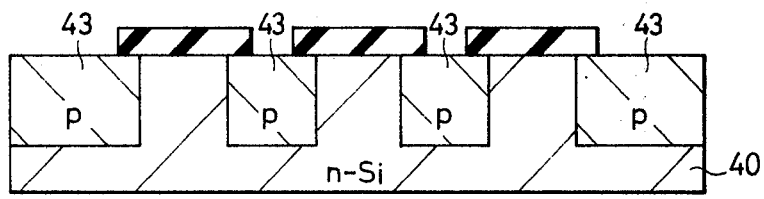

Subsequently, as shown in FIG. 10B, the ion-implanted p-type impurity is thermally diffused under the conditions of, e.g. a temperature of 1,200° C. and a period of time of 2–6 hours, to thereby form p-type wells 43 being 2–6 μm deep.

Figure 10C:
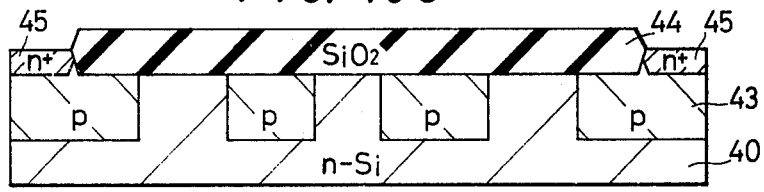

Subsequently, as shown in FIG. 10C, a thick SiO$_2$ film 44 having a thickness of 0.4–1.5 μm is formed by local oxidation or the like, and impurity layers 45 are formed in the p-type wells 43.

Figure 10D:
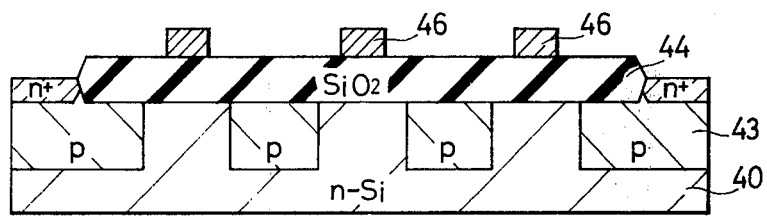

Thereafter, as shown in FIG. 10D, interconnection layers 46 of a first layer which are 0.2–0.5 μm thick are formed of aluminum, polycrystalline silicon or a high-melting metal (for example, molybdenum or tungsten or a silicide thereof).

Figure 10E:
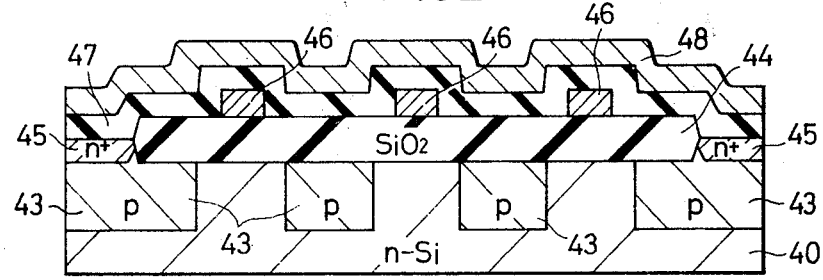

Next, as shown in FIG. 10E, an isulating film 47 which is made of PSG or the like and which is 0.4–1.5 μm thick is formed, and an interconnection layer 48 of a second layer is formed thereon.

As set forth above, it has become possible, according to this invention to reduce the parasitic capacitance of an interconnection portion with a simple structure without forming an extremely thick insulating film under an interconnection layer. This greatly contributes to enhancing the operating speeds of ICs and LSIs of high packaging densities.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A semiconductor integrated circuit device comprising:
    a semiconductor body of a first conductivity type;
    an insulating layer disposed on a major surface of said semiconductor body;
    an interconnection layer disposed on said insulating layer so as to overlie a first portion of said semiconductor body, which first portion comprises a surface portion at said major surface and an interior portion formed in said semiconductor body under said surface portion, and wherein a series capacitance is formed of the capacitance across said insulating layer between said interconnection layer and said body and through a depletion layer formed in said body beneath said insulating layer, and
    further including means for reducing said series capacitance independently of the thickness of said insulating layer, wherein said reducing means includes means for increasing the depth of said depletion layer formed in said body, said means comprising a well-shaped semiconductor region of a second conductivity type, opposite said first conductivity type, formed to extend into said semiconductor body from said major surface thereof and forming a PN junction with said body, and means for biasing said PN junction so as to impart a depletion region from said well-shaped region into said interior portion of said first portion of said body beneath said interconnection layer, wherein said well-shaped region is disposed to at least partially surround said interior portion of said first portion on said major surface so that first and second regions of said well-shaped semiconductor region will face each other with said interior portion of said first portion being interposed between said first and second regions, and wherein said well-shaped semiconductor region contains semiconductor circuit elements therein.

2. A semiconductor integrated circuit device comprising:
    a semiconductor body of a first conductivity type;
    an insulating layer diposed on a major surface of said semiconductor body;
    an interconnection layer disposed on said insulating layer so as to overlie a first portion of said semiconductor body, which first portion comprises a surface portion at said major surface and an interior portion formed in said semiconductor body under said surface portion, and wherein a series capacitance is formed of the capacitance across said insulating layer between said interconnection layer and said body and through a depletion layer formed in said body beneath said insulating layer, and
    further including means for reducing said series capacitance independently of the thickness of said insulating layer, wherein said reducing means includes means for increasing the depth of said depletion layer formed in said body, said means comprising at least first and second well-shaped semiconductor regions of a second conductivity type, opposite said first conductivity type, formed to extend into said semiconductor body from said major surface thereof and forming a PN junction with said body, and means for biasing said PN junction so as to impart depletion regions from said well-shaped regions into said interior portion of said first portion of said body beneath said interconnection layer, wherein said well-shaped regions are disposed to at least partially surround said interior portion of said first portion on said major surface so that said first and second well-shaped regions will face each other with said interior portion of said first portion being interposed between said first and second well-shaped regions, and wherein said well-shaped semiconductor regions contain semiconductor circuit elements therein.

3. A semiconductor integrated circuit device according to claim 2, wherein the lateral extent of each of said depletion regions extending in a direction parallel to the surface of said body is such as to intersect a neighboring depletion region adjacent thereto.

4. A semiconductor integrated circuit device according to claim 3, wherein the shape of each of said depletion regions as viewed in a direction normal to the surface of said body is substantially square.

5. A semiconductor integrated circuit device according to claim 3, wherein the shape of each of said depletion regions as viewed in a direction normal to the surface of said body is substantially hexagonal.

6. A semiconductor integrated circuit device according to claim 2, wherein said interconnection layer extends longitudinally on the surface of said insulating layer and said first and second well-shaped regions extend longitudinally in parallel on opposite sides of said interconnection layer.

* * * * *